United States Patent
Cao et al.

(10) Patent No.: US 9,659,939 B1
(45) Date of Patent: May 23, 2017

(54) INTEGRATED CIRCUIT HAVING MIM CAPACITOR WITH REFRACTORY METAL SILICIDED STRAP AND METHOD TO FABRICATE SAME

(71) Applicant: International Business Machines Corporation, Armonk, NY (US)

(72) Inventors: Qing Cao, Yorktown Heights, NY (US); Kangguo Cheng, Schenectady, NY (US); Zhengwen Li, Scarsdale, NY (US); Fei Liu, Yorktown Heights, NY (US); Zhen Zhang, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/953,754

(22) Filed: Nov. 30, 2015

(51) Int. Cl.
*H01L 27/108* (2006.01)

(52) U.S. Cl.
CPC .. *H01L 27/10829* (2013.01); *H01L 27/10847* (2013.01)

(58) Field of Classification Search
CPC ............... H01L 27/10829; H01L 27/10847
See application file for complete search history.

(56) References Cited

U.S. PATENT DOCUMENTS

| | | | |
|---|---|---|---|
| 4,673,962 A | 6/1987 | Chatterjee et al. | |
| 5,102,817 A | 4/1992 | Chatterjee et al. | |
| 6,750,097 B2 | 6/2004 | Divakaruni et al. | |
| 7,388,244 B2 | 6/2008 | Ho et al. | |
| 7,750,388 B2 | 7/2010 | Ho et al. | |
| 8,310,052 B2 | 11/2012 | Torazawa | |
| 2005/0101120 A1 | 5/2005 | Hause et al. | |
| 2007/0057302 A1* | 3/2007 | Ho | H01L 28/91 257/301 |
| 2012/0248522 A1* | 10/2012 | Goyal | H01L 27/10832 257/301 |
| 2014/0054664 A1* | 2/2014 | Messenger | H01L 21/84 257/301 |
| 2015/0221715 A1 | 8/2015 | Cheng et al. | |

* cited by examiner

*Primary Examiner* — Christine Enad
(74) *Attorney, Agent, or Firm* — Harrington & Smith; Louis J. Percello

(57) ABSTRACT

A method includes forming a trench in a Silicon substrate; depositing metal on sidewalls and a bottom of the trench; annealing to react the metal with underlying Si and form metal silicide adjacent to sidewalls and bottom of the trench; removing unreacted metal and depositing a dielectric layer on the metal silicide, a metal layer over the dielectric layer and polysilicon to fill a remainder of the trench thereby forming top plate electrode of a MIM capacitor. The method further forms a transistor adjacent to a top of the trench, where the transistor is connected to the top plate electrode of the MIM capacitor via a strap interface that comprises a portion of the metal silicide layer at the top of the trench. The portion of the metal silicide layer can be disposed in an SOI layer, and silicide in the Si substrate forms a bottom plate of the capacitor.

17 Claims, 10 Drawing Sheets

INTEGRATED CIRCUIT HAVING MIM CAPACITOR WITH REFRACTORY METAL SILICIDED STRAP AND METHOD TO FABRICATE SAME

TECHNICAL FIELD

The various embodiments of this invention relate generally to semiconductor devices and fabrication techniques and, more specifically, relate to the fabrication of semiconductor transistor devices that are connected with metal-insulator-metal (MIM) trench capacitors for use in memory and other circuitry.

BACKGROUND

A MIM capacitor can be considered as a trench-type parasitic capacitor with an insulator layer disposed between two metal layers. A conventional connection (strap) interface between a deep trench (DT) MIM capacitor and an adjacent transistor, e.g., a planar field effect transistor (FET) or a FinFET, typically suffers from having a high resistance due at least to the area of the strap. The high interface resistance can detrimentally affect performance, such as when the DT MIM capacitor is used in a dynamic random access memory (DRAM) application such as an embedded DRAM (eDRAM) application.

SUMMARY

In a first aspect thereof the embodiments of this invention provide a method that comprises forming a trench in a Silicon substrate; depositing metal on sidewalls and a bottom of the trench; annealing the deposited metal to react the metal with underlying Si and form a layer of metal silicide adjacent to sidewalls and the bottom of the trench; removing unreacted deposited metal; depositing a dielectric layer on the layer of metal silicide, a metal layer over the dielectric layer and polysilicon to fill the remainder of the trench thereby forming a top plate electrode of a metal-insulator-metal (MIM) capacitor in the trench; and forming a transistor adjacent to a top of the trench, where the transistor is connected to the top plate electrode of the MIM capacitor via a strap interface that comprises a portion of the metal silicide layer at the top of the trench.

In a second aspect thereof the embodiments of this invention provide a method that comprises forming a deep trench in a semiconductor on insulator (SOI) structure through a layer of SOI, a BOX layer and into a Si substrate; depositing a metal on deep trench sidewalls and bottom; annealing to form silicide on SOI and substrate trench sidewalls and bottom by reacting the metal with Si of the layer of SOI and the substrate; removing unreacted metal; depositing a high-k dielectric layer on trench sidewalls and bottom; depositing a second metal on top of the high-k dielectric layer to form a MIM capacitor in the trench; and forming a transistor with one of its source or drain terminals electrically connected to the silicide on SOI sidewalls.

In another aspect thereof the embodiments of this invention provide a DRAM cell that comprises a structure comprising a Si substrate having an overlying oxide layer and a semiconductor on insulator (SOI) layer disposed on the oxide layer. The structure is comprised of a trench that extends through the SOI layer and through the oxide layer into the Si substrate. The structure is further comprised of a trench capacitor formed in the trench and a transistor formed in the SOT layer. In the DRAM cell a silicide on trench sidewalls in the SOT layer and in the underlying Si substrate simultaneously serves, in the Si substrate, as a bottom electrode of the trench capacitor, and in the SOI layer serves as an electrical connection between the transistor and the trench capacitor to reduce strap interface resistance.

BRIEF DESCRIPTION OF THE SEVERAL VIEWS OF THE DRAWINGS

FIGS. 1-11 can be viewed as depicting a process flow diagram in accordance with embodiments of this invention. More specifically:

FIG. 1 shows a starting structure (starting wafer) that includes a substrate, an overlying BOX layer, an overlying SOT layer, an oxide layer, a PAD nitride layer and an overlying high density plasma oxide layer;

FIG. 2 shows the structure of FIG. 1 after applying a photoresist layer and performing a deep trench (DT) hard mask (HM) open etch to form openings through the layer stack to expose the Si substrate;

FIG. 3 shows the structure of FIG. 2 after stripping the photoresist layer and forming a deep trench (DT) into the Si substrate;

FIG. 4 shows the structure of FIG. 3 after performing an optional step of widening a lower portion of the DT;

FIG. 5 shows the structure of FIG. 3 (or FIG. 4) after performing a blanket deposition of a thin layer of metal to cover sidewalls and the bottom of the DT;

FIG. 6 shows the structure of FIG. 5 after performing an anneal to form self-aligned refractory metal silicide where the Si of the substrate and the SOT layer is exposed;

FIG. 7 shows the structure of FIG. 6 after selectively etching off unreacted metal versus the metal silicide;

FIG. 8 shows the structure of FIG. 7 after depositing a high dielectric constant (HK) layer, a TiN layer and polysilicon;

FIG. 9 shows the structure of FIG. 8 after removing a portion of the structure down and into the Box layer and etching the polysilicon, the TiN layer and the HK layer contained within the SOI to recess to the polysilicon within the BOX layer;

FIG. 10 shows the structure of FIG. 9 after blanket depositing additional poly (poly 2), removing excess poly 2 from the surface and planarizing the top surface of the structure; and FIG. 11 shows the structure of FIG. 10 after fabricating an array transistor, where the silicide disposed in the SOI layer functions as a self-aligned strap to connect the array transistor to the MIM capacitor formed from the silicide in the substrate, the HK layer and the polysilicon.

DETAILED DESCRIPTION

Figure 1:
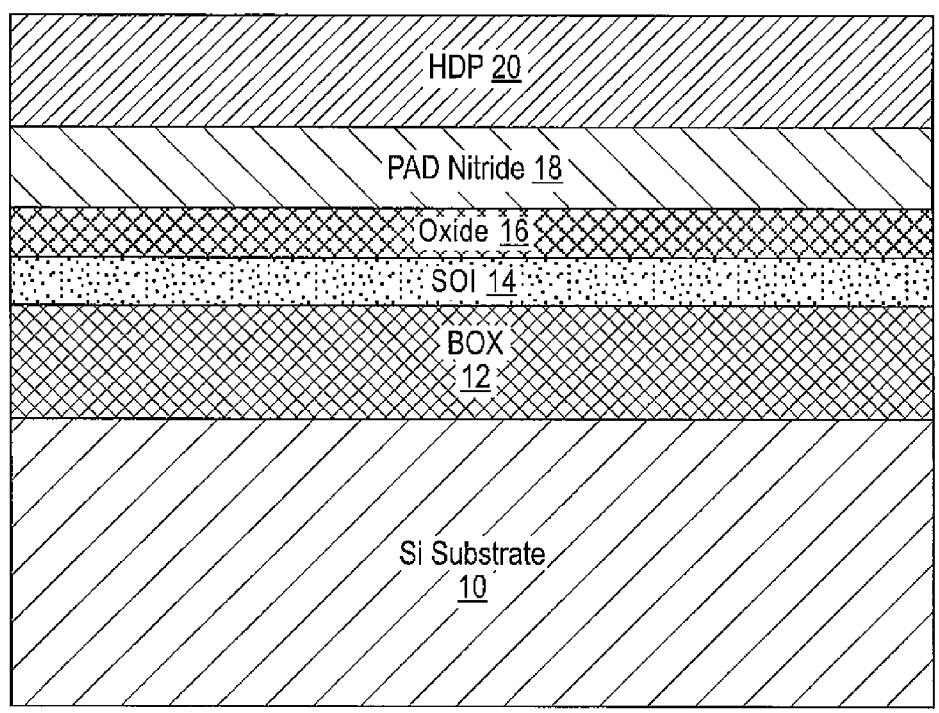
FIGS. 1-11 are each an enlarged cross-sectional view showing various initial, intermediate and completed or substantially completed structures that are fabricated in accordance with embodiments of this invention, wherein the various layer thicknesses and other dimensions are not drawn to scale.

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a <100> crystal surface will take on a <100> orientation. In some embodiments, epitaxial growth and/or deposition processes are selective to forming on semiconductor surface, and do not deposit material on dielectric surfaces, such as silicon dioxide or silicon nitride surfaces.

Examples of various epitaxial growth process apparatuses and methods that are suitable for use in implementing the embodiments of this invention can include, but are not limited to, chemical vapor deposition (CVD) such as, for example, rapid thermal chemical vapor deposition (RTCVD), atmospheric pressure chemical vapor deposition (APCVD), low pressure chemical vapor deposition (LP-CVD) and ultra-high vacuum chemical vapor deposition (UHVCVD). Other suitable epitaxial growth processes can include, but are not limited to, molecular beam epitaxy (MBE) and low-energy plasma deposition (LEPD). The temperature for an epitaxial deposition process typically ranges from about 300° C. to about 900° C. Although higher temperature will typically result in faster deposition of the semiconductor material, the faster deposition may also result in crystal defects and film cracking.

In at least one embodiment thereof this invention can employ semiconductor on insulator (SOI) technology where a thin semiconductor layer, such as a layer of SiGe or a layer of Si, is formed over an insulating layer, such as silicon oxide, which in turn is formed over a (bulk) substrate, such as a Si substrate. The insulating layer can be referred to as a buried oxide (BOX) layer or simply as a BOX. For a single BOX SOI wafer the SOI layer can be divided into active regions by shallow trench isolation (STI) which intersects the BOX and provides total isolation for active device regions formed in the SOI layer. For FinFET devices fin structures can be defined in the SOI layer and sources and drains can be formed, for example, by ion implantation of N-type or P-type dopants into the fins. A FET channel region between a source/drain pair can be created so as to underlie a gate structure.

In at least one conventional approach the strap interface between the FinFET and the DT MIM capacitor can be N+ SOI/nitride/N+ polysilicon (poly). For a case of a Fin height of approximately 35 nm and a Fin width of approximately 10 nm the strap interface contact area can be about 100 $nm^2$–500 $nm^2$ and the contact resistance can be about 10 k ohm/cell. As an example, with a contact area of 10 nm×35 nm, or about 350 $nm^2$, the specific contact resistivity is 10K ohm×350 $nm^2$=3×10 ohm $cm^2$.

The exemplary embodiments of this invention significantly reduce the specific contact resistivity by instead using for the strap interface N+ SOI/metal silicide such as N-metal $TiSi_2$/N+ poly. The $TiSi_2$/N+Si specific contact resistivity can be about $10^{-8}$ ohm $cm^2$, so as a result $10^{-8}$ ohm $cm^2$/(350×$10^{-14}$ $cm^2$)=3 k ohm per interface.

With the FIN-DT structure made possible by the use of the exemplary embodiments of this invention the strap area of the FIN connection to the DT poly can be reduced by as much as about 30 times. If one assumes that the connection in the conventional case between the FIN and a DT 14 nm SOI has an interface resistance of about 10K ohms/cell, by using silicide in the Fin/poly interface the total resistance can be reduced to only about 330 ohm/cell (two sides).

As will be described in detail below, the embodiments of the method of this invention employ chemical vapor deposition (CVD) or atomic layer deposition (ALD) of a metal, such as Nickel (Ni), Tungsten (W), Titanium (Ti), Cobalt (Co), Platinum (Pt) or Ruthenium (Ru), with high conformality into deep trenches at a temperature in a range of about 400° C. to about 600° C. so as to form a thin metal layer (e.g., about 5 nm to about 20 nm thick) on exposed Si. An anneal operation is performed to form self-aligned refractory silicide where the Si is exposed. The method then selectively etches away unreacted metal, leaving metal silicide on top of the Si, a bottom capacitor plate and a SOT sidewall. A high dielectric constant insulator layer is then deposited followed by a conductive layer, e.g., a metal layer comprised of TIN, followed by a polysilicon fill forming the MIM capacitor. A conventional eDRAM process flow can then be performed to fill a transistor structure connected to the MIM capacitor via a metal silicide strap interface, without other major process changes being required.

FIG. 1 shows a starting structure (starting wafer) that includes a substrate, e.g., a Si substrate 10, an overlying BOX layer 12, an overlying SOT layer 14, an oxide layer 16, a buffer nitride layer (PAD nitride layer 18) and an overlying high density plasma oxide (HDP) layer 20. In exemplary embodiments the Si substrate can have any thickness that is suitable for containing the deep trenches that contain the to-be-formed MIM capacitors (e.g., about 2 μm to about 5 μm), and the BOX layer 12 can have a thickness in a range of about 150 nm to about 250 nm. The SOI layer can have a thickness of, for example, about 20 nm to about 50 nm and can comprise, for example, doped Si, or SiGe. The oxide layer 16 can be a layer of thermally grown $SiO_2$ having a thickness of about 8 nm. Representative and exemplary dimensions for the PAD nitride layer 18 and the HDP layer 20 can be about 120 nm and about 1000 nm, respectively. All of these layer thicknesses and ranges of layer thicknesses are provided as non-limiting examples.

Figure 2:
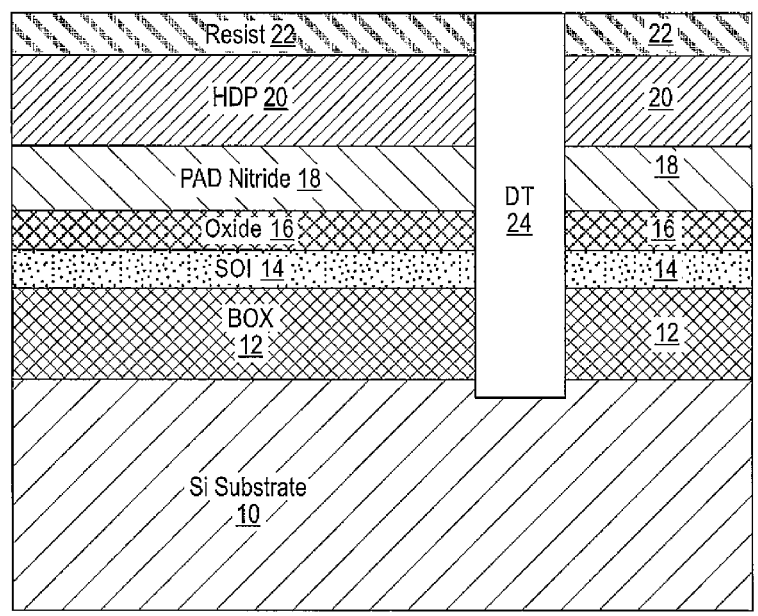

FIG. 2 shows the structure of FIG. 1 after performing a deep trench (DT) hard mask (HM) open etch to form openings through the layers 12-20 to expose the Si substrate 10. This step can involve depositing a layer of photoresist 22 and then photolithographically defining areas where deep trenches will be formed by creating openings in the photoresist layer 22. The underlying layers 12-20 are then etched stopping at the Si substrate 10 or extending into the Si substrate as shown. The width of the etched openings can be, for example, in a range of about 70 nm to about 120 nm. A multi-step etching process can be performed to etch each of the layers as required. It is noted that in FIG. 2 one opening is shown, whereas in a typical case there can be thousands or millions of such openings formed, depending on the number of DT MIM capacitors that are to be formed.

Figure 3:
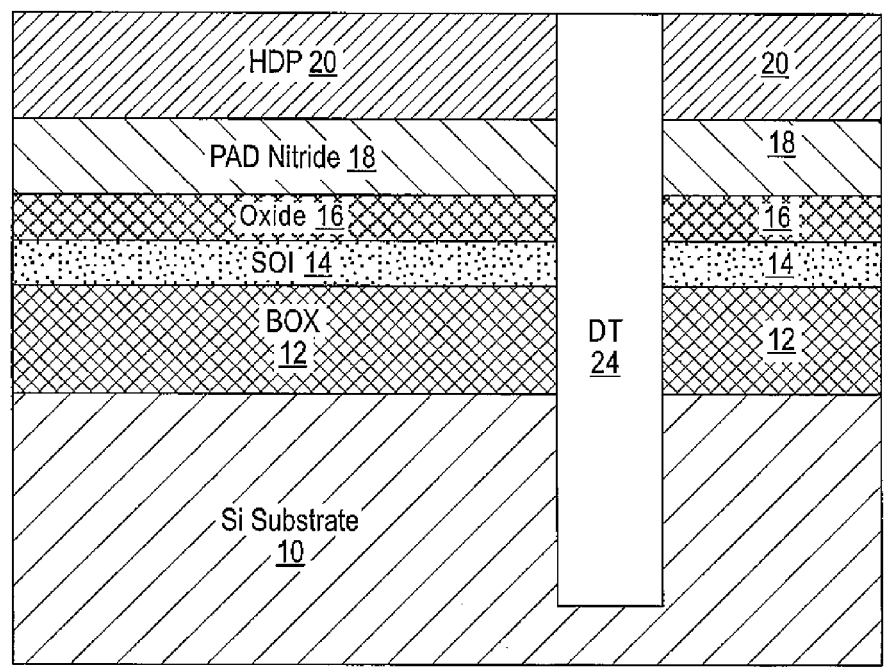

FIG. 3 shows the structure of FIG. 2 after stripping the photoresist layer 22 and performing a DT Si reactive ion etch (RIE) process to form deep trenches 24 to a depth of, for example, about 2 μm to about 5 μm into the Si substrate 10. The RIE chemistry can include a Fluorine-based etchant, a Chlorine-based etchant, or HBr or Bra as an etchant.

Figure 4:
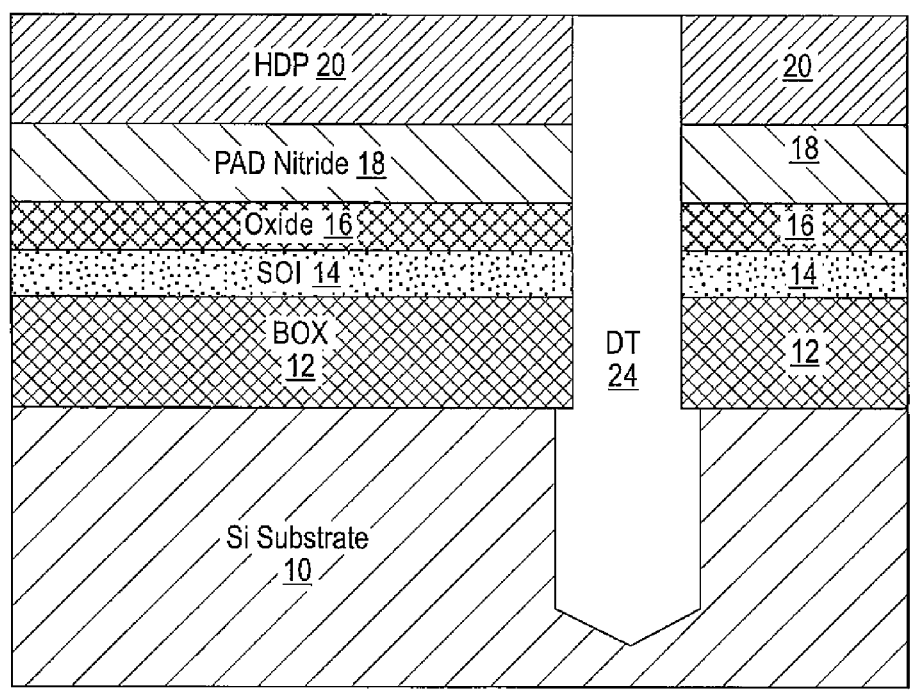
Figure 5:
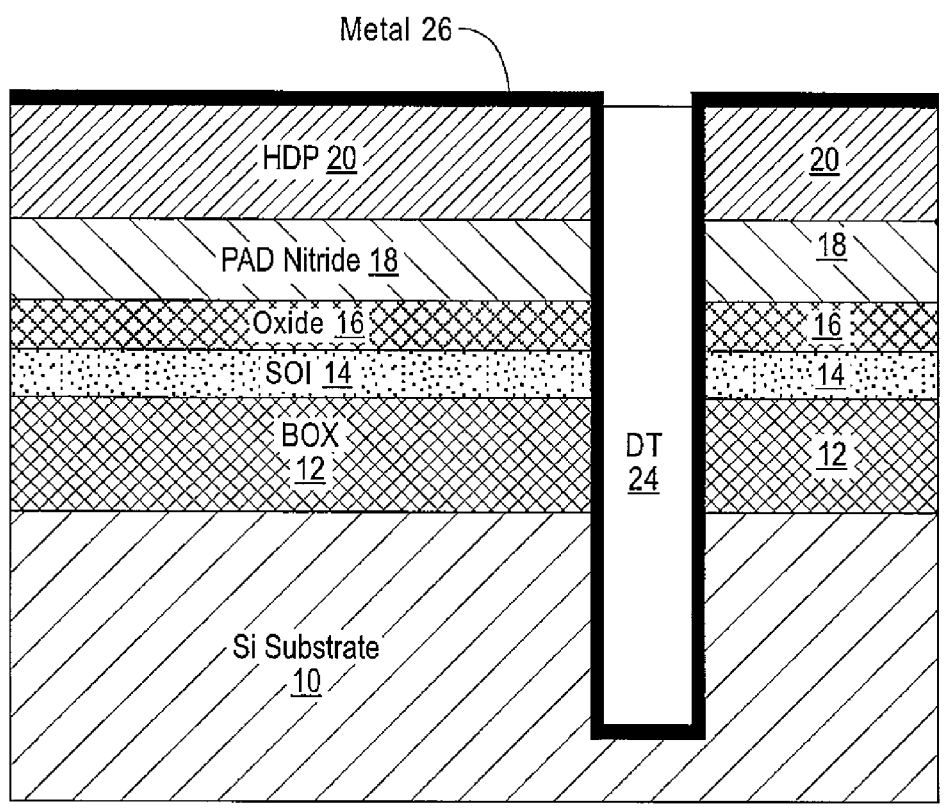

FIG. 4 shows the structure of FIG. 3 after performing an optional step of widening the lower portion of the DT 24 to increase the surface area. This can be achieved by the use of an anisotropic etch, such as one using ammonium hydroxide ($NH_4OH$). FIG. 5 shows the structure of FIG. 3 (or FIG. 4) after performing a CVD or an ALD blanket deposition, at a temperature in a range of about 400° C. to about 600° C., of a thin (e.g., 5 nm-20 nm) layer of metal 26 to cover the sidewalls and the bottom of the DT 24. The metal could be one of, as non-limiting examples, Ni, W, Ti, Co, Pt or Ru.

Figure 6:
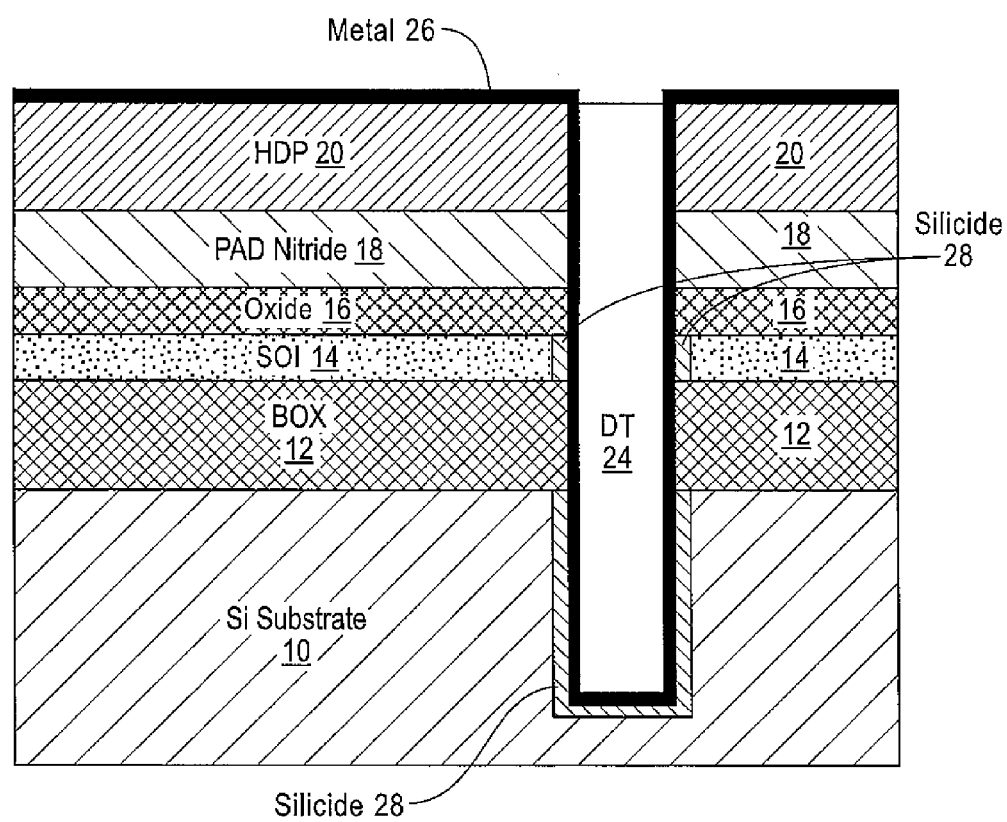

FIG. 6 shows the structure of FIG. 5 after performing an anneal operation to form self-aligned refractory silicide where the Si of the substrate 10 and the SOI layer 14 is exposed. As can be seen a portion of the Si exposed on the sidewalls and bottom of the DT 24 is converted to silicide. The temperature and time are dependent on the metal 26. As several non-limiting examples, when the metal 26 is Ti the anneal temperature can be in a range of about 700° C. to about 900° C., when the metal 26 is W the anneal temperature can be in a range of about 700° C. to about 900° C., and when the metal 26 is Co the anneal temperature can be in a range of about 450° C. to about 600° C.

Figure 7:
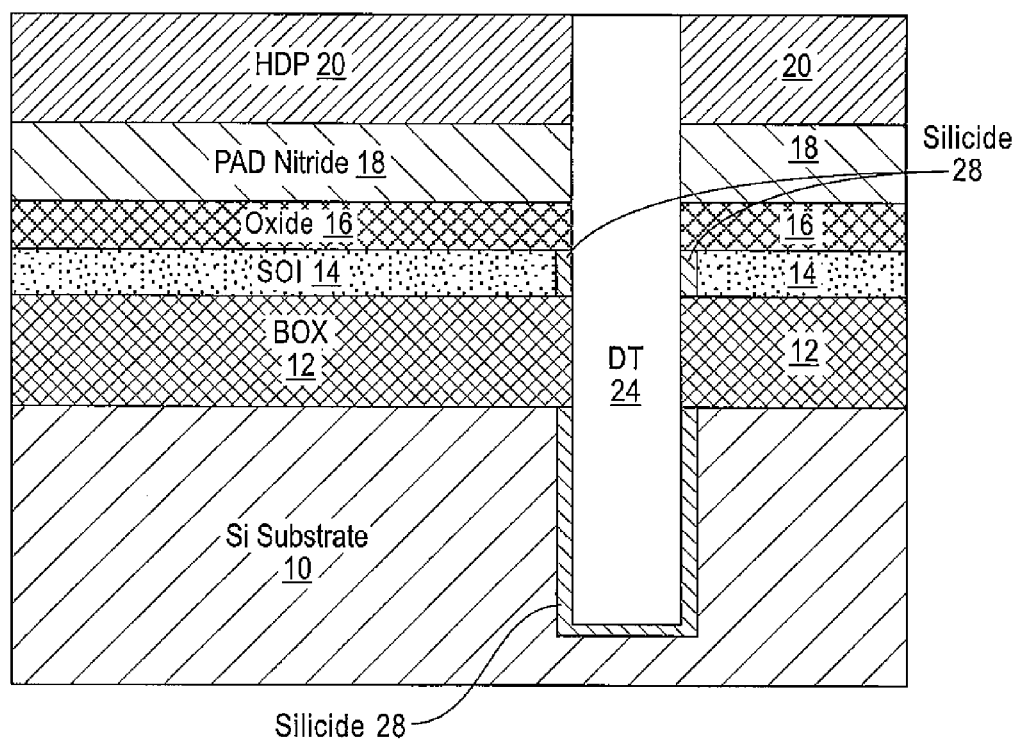

FIG. 7 shows the structure of FIG. 6 after selectively etching off the unreacted metal 26 versus the metal silicide 28. The etch can be a wet chemical etch using an etchant that removes the metal selective to the silicide. For example, a wet etchant solution of $H_2O_2:H_2SO_4:H_2O$ can be used to etch off unreacted Ti selectively to $TiSi_2$.

Figure 8:
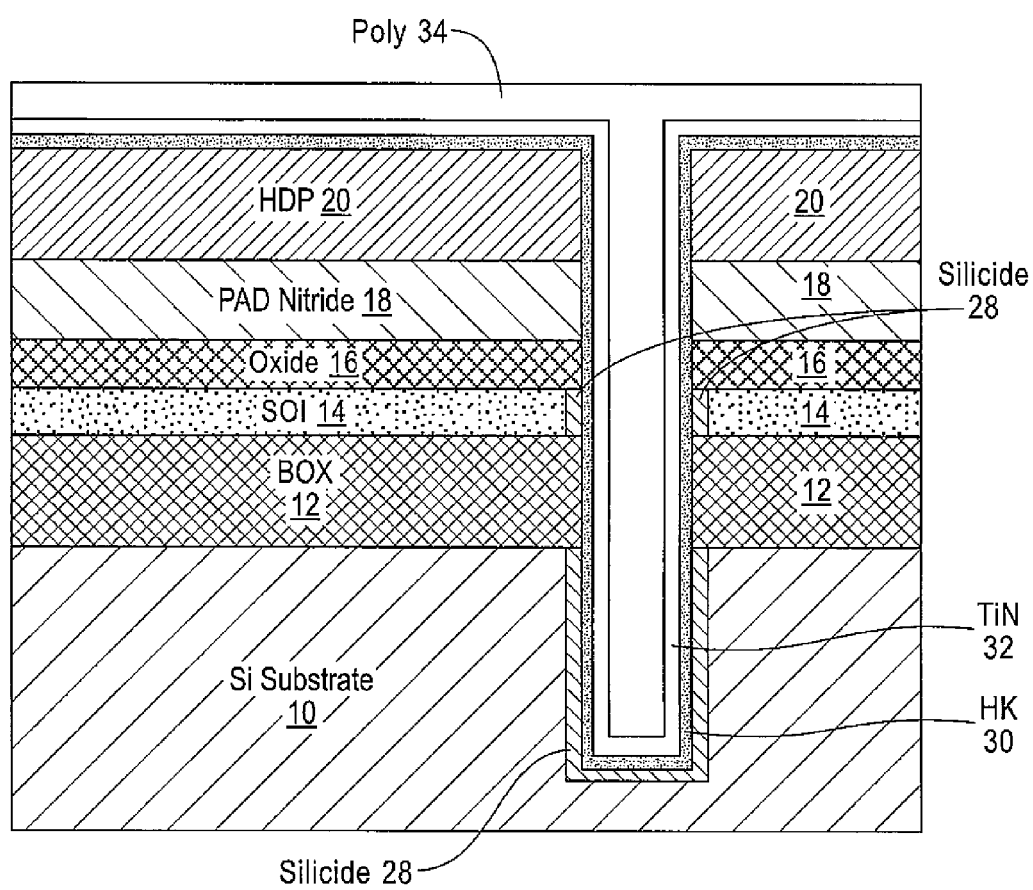

FIG. 8 shows the structure of FIG. 7 after depositing a dielectric layer, e.g., a high dielectric constant (HK) layer 30, a TiN layer 32 and polysilicon (poly) 34. The HK layer 30 and the TiN layer 32 are relatively thin, e.g., a few nanometers, and the poly 34 is applied to fill the remaining volume of the DT. The HK layer 30 can be dielectric metal oxide having a dielectric constant that is greater than the dielectric constant of silicon nitride (7.5). The HK layer 30 may be formed by methods well known in the art including, for example, chemical vapor deposition (CVD), atomic layer deposition (ALD), pulsed laser deposition (PLD) and liquid source misted chemical deposition (LSMCD), etc. The HK layer 30 comprises a metal and oxygen, and optionally nitrogen and/or silicon. Exemplary high-k dielectric materials include $HfO_2$, $HfSi_xO_y$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiOXN_y$, $SrTiO_xN_y$, $LaAlO_xN_y$, $Y_2O_xN_y$, a silicate thereof, and an alloy thereof. Each value of x is independently established from about 0.5 to about 3.0 and each value of y is independently established from about 0 to about 2.0. The thickness of the HK layer 30 may be from about 1 nm to about 10 nm, and more preferably from about 1.5 nm to about 3 nm.

Figure 9:
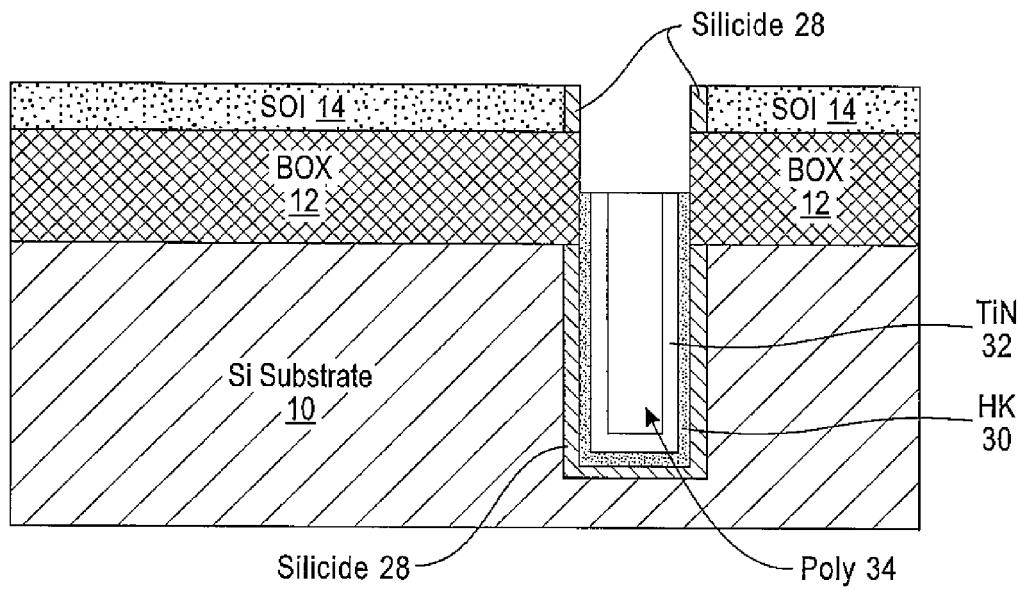

FIG. 9 shows the structure of FIG. 8 after removing a portion of the structure down and into BOX 12, such as about half-way through the layer of BOX 12, by etching a portion of the poly 34, the TiN 32 and the HK 30 layers contained within the BOX 12. This step insures that in the completed MIM device the TiN 32 and the HK 30 layers are not in contact with the SOI layer 14 which would degrade device performance. This step thus recesses the poly 34 within the BOX 12.

Figure 10:
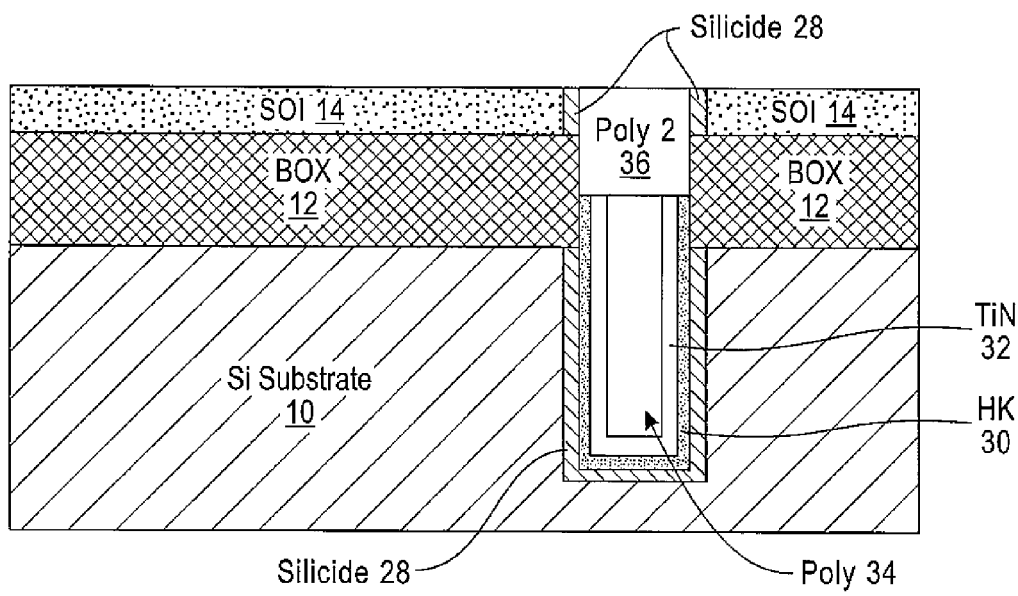

FIG. 10 shows the structure of FIG. 9 after blanket depositing additional N+ poly (poly 2) 36 and performing a chemical mechanical polish (CMP) operation to remove excess poly 2 from the surface and to planarize the top surface of the structure. The N+ poly 2 36, in combination with the poly 34 that is in contact with the TiN layer 32, will function as the top plate electrode of the MIM capacitor in the completed device, while the HK layer 30 will function as the insulator and the silicide 28 disposed in the substrate 10 portion of the DT 24 will function as the bottom plate of the MIM capacitor in the completed device.

Figure 11:
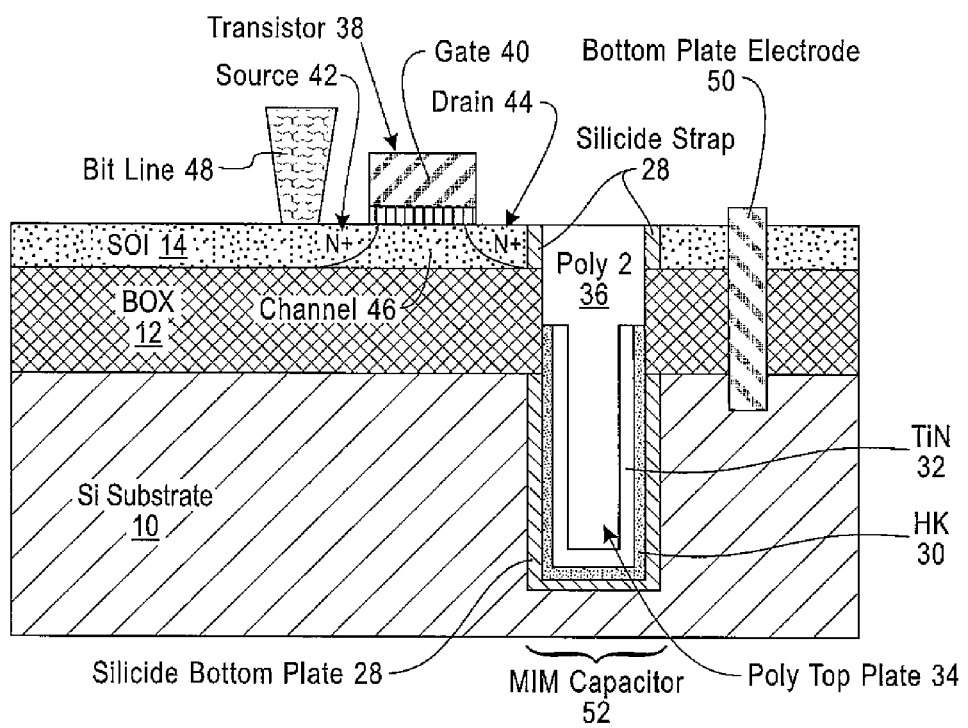

FIG. 11 shows the structure of FIG. 10, after fabricating the array transistor 38, and can be generally considered as illustrating a DRAM cell, such as an eDRAM cell. The fabrication of the array transistor 38 and connections to the array transistor 38 can be conventional in nature. The array transistor 38 can be any desired type of transistor such as a FinFET, or a nanowire transistor, or a planar transistor as depicted. The array transistor 38 includes a gate stack 40 (disposed on a thin layer of gate dielectric), an N+ source 42 and an N+ drain 44 (e.g., doped with Phosphorus). A channel 46 underlies the gate stack 40. A bit line 48 is formed to connect to the source 42. A bottom plate electrode 50 is also formed to extend through the SOI layer 14 and the BOX 12 into the substrate 10. The substrate 10 is assumed to be suitably doped (e.g., a P-type dopant such as Boron at a concentration of, for example, $10^{19}$-$10^{20}$ atoms/cm³) so as to provide a conductive path between the bottom plate electrode 50 and the silicide bottom plate 28 of the MIM capacitor 52.

As can be seen in FIG. 11, the silicide 28 disposed in the SOI 14 portion of the DT 24 functions in combination with the N+Si of the SOI layer 14 as a self-aligned strap to connect the drain 44 of the memory array transistor 38 to the MIM capacitor 52 in the completed device, thereby realizing the significant reduction in specific resistivity that was discussed above.

It is to be understood that the exemplary embodiments discussed above with reference to FIGS. 1-11 can be used with common variants of a FET device including, e.g., FET devices with multi-fingered FIN and/or gate structures and FET devices of varying gate width and length. Moreover, transistor devices can be connected to metalized pads or other devices by conventional ultra-large-scale integration (VLSI) metalization and lithographic techniques.

Integrated circuit dies can be fabricated with various devices such as a field-effect transistors, bipolar transistors, metal-oxide-semiconductor transistors, diodes, resistors, capacitors, inductors, etc. An integrated circuit in accordance with the present invention can be employed in applications, hardware, and/or electronic systems. Suitable hardware and systems in which such integrated circuits can be incorporated include, but are not limited to, personal computers, communication networks, electronic commerce systems, portable communications devices (e.g., cell phones), solid-state media storage devices, functional circuitry, etc. Systems and hardware incorporating such integrated circuits are considered part of this invention. Given the teachings of the invention provided herein, one of ordinary skill in the art will be able to contemplate other implementations and applications of the techniques of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As such, various modifications and adaptations may become apparent to those skilled in the relevant arts in view of the foregoing description, when read in conjunction with the accompanying drawings and the appended claims. As but some examples, the use of other similar or equivalent semiconductor fabrication processes, including deposition processes and etching processes and etching chemistries may be used by those skilled in the art. Further, the exemplary embodiments are not intended to be limited to only those materials, metals, insulators, dopants, dopant concentrations, layer thicknesses, anneal temperatures and the like that were specifically disclosed above. Any and all such and similar modifications of the teachings of this invention will still fall within the scope of this invention.

What is claimed is:

1. A method comprising:
   forming a trench in a Silicon substrate;
   depositing metal on sidewalls and a bottom of the trench;
   annealing the deposited metal to react the metal with underlying Si and form a layer of metal silicide adjacent to sidewalls and the bottom of the trench;
   removing unreacted deposited metal;
   depositing a dielectric layer on the layer of metal silicide, where the layer of metal silicide functions as a bottom plate, a metal layer over the dielectric layer to form a top plate and electrically conductive polysilicon to fill the remainder of the trench thereby forming a top plate electrode of a metal-insulator-metal (MIM) capacitor in the trench; and
   after forming the top plate electrode of the MIM capacitor in the trench, forming a transistor adjacent to a top of the trench, where the transistor is formed so as to be connected to the top plate electrode of the MIM capacitor via a self-aligned strap interface that comprises a portion of the metal silicide layer that is disposed at the top of the trench.

2. The method of claim 1, where the Si substrate has an overlying oxide layer and a semiconductor on insulator (SOI) layer disposed on the oxide layer, where the trench extends through the SOI layer and through the oxide layer, and where the portion of the metal silicide layer at the top of the trench is located in the SOI layer.

3. The method of claim 2, where the layer of metal silicide is present only in the SOI layer and in the Si substrate, where the step of depositing the dielectric layer on the layer of metal silicide, the metal layer over the dielectric layer and the polysilicon further comprises removing from a top portion of the trench down and into the oxide layer the deposited metal layer over the dielectric layer, the dielectric layer and the polysilicon.

4. The method of claim 3, further comprising depositing additional polysilicon into the top portion of the trench to comprise a top portion of the top plate electrode.

5. The method of claim 1, where the dielectric layer is a high dielectric constant layer comprised of a metal oxide, and where the metal layer is comprised of Titanium Nitride (TiN).

6. The method of claim 1, where the metal deposited on sidewalls of the trench is comprised of one of Nickel (Ni), Tungsten (W), Titanium (Ti), Cobalt (Co), Platinum (Pt) or Ruthenium (Ru).

7. The method of claim 1, where the step of depositing metal on sidewalls of the trench comprises an initial step of enlarging a bottom portion of the trench to increase the surface area.

8. A method comprising:
   forming a deep trench in a semiconductor on insulator (SOI) structure through a layer of SOI, a BOX layer and into a Si substrate;
   depositing a metal on deep trench sidewalls and bottom;
   annealing to form silicide on SOI and substrate trench sidewalls and bottom by reacting the metal with Si of the layer of SOI and the substrate;
   removing unreacted metal;
   depositing a high-k dielectric layer on trench sidewalls and bottom;
   depositing a second metal on top of the high-k dielectric layer and electrically conductive polysilicon to cover the second metal to form a MIM capacitor in the trench; and
   after forming the MIM capacitor in the trench, forming a transistor in the layer of SOI with one of its source or drain terminals electrically connected to the silicide on SOI sidewalls, where the silicide on the SOI sidewalls functions as a self-aligned silicide strap to electrically couple one of the transistor source or drain terminals to the second metal via the electrically conductive polysilicon, where the second metal functions as a top plate of the MIM capacitor and where the silicide disposed on the substrate trench sidewalls and bottom functions as a bottom plate of the MIM capacitor.

9. The method of claim 8, where the high-k dielectric layer is comprised of a metal oxide, and where the second metal is comprised of Titanium Nitride (TiN).

10. The method of claim 8, where the metal deposited on deep trench sidewalls and bottom is comprised of one of Nickel (Ni), Tungsten (W), Titanium (Ti), Cobalt (Co), Platinum (Pt) or Ruthenium (Ru).

11. The method of claim 8, where the step of depositing a metal on deep trench sidewalls and bottom comprises an initial step of enlarging a bottom portion of the trench to increase the surface area.

12. The method of claim 8, where the steps of depositing the high-k dielectric layer and the second metal layer on the high-k dielectric layer further comprises depositing first polysilicon to fill a remainder of the trench, and the method further comprises removing from a top portion of the trench down and into the BOX layer the deposited second metal layer, the dielectric layer and the first polysilicon.

13. The method of claim 12, further comprising depositing additional polysilicon into the top portion of the trench to comprise a top portion of a top plate electrode.

14. A DRAM cell comprising:
   a structure comprising a Si substrate having an overlying oxide layer and a semiconductor on insulator (SOI) layer disposed on the oxide layer, the structure comprised of a trench that extends through the SOI layer and through the oxide layer into the Si substrate;

a trench capacitor formed in the trench; and a transistor formed in the SOI layer, where a silicide layer on trench sidewalls in the SOI layer and in the underlying Si substrate simultaneously serves, in the Si substrate, as a bottom plate of the trench capacitor, and in the SOI layer serves as a self-aligned electrical silicide strap connection between the transistor and the trench capacitor to reduce strap interface resistance;

where the trench capacitor is a MIM capacitor comprised of the bottom plate that comprises the silicide in the Si substrate, a dielectric insulator layer disposed over the silicide, and a top plate that comprises a metal layer disposed over the dielectric insulator layer; and where a remainder of the trench is filled with electrically conductive polysilicon that comprises a top plate electrode of the MIM capacitor, whereby the transistor is electrically coupled by the self-aligned silicide strap to the top plate of the MIM capacitor via the top plate electrode comprised of the electrically conductive polysilicon.

15. The DRAM cell of claim 14, where the metal layer disposed over the high-k dielectric layer is comprised of Titanium Nitride (TiN).

16. The DRAM cell of claim 14, where the silicide is one of a Nickel (Ni), Tungsten (W), Titanium (Ti), Cobalt (Co), Platinum (Pt) or Ruthenium (Ru) silicide.

17. The DRAM cell of claim 14, where the Si substrate is doped so as to be electrically conductive and further comprising a bottom plate electrode that extends through the SOI layer and the dielectric layer into the Si substrate, the bottom plate electrode being electrically connected via the Si substrate to the bottom plate that comprises the silicide.

* * * * *